US012583204B2

(12) United States Patent (10) Patent No.: US 12,583,204 B2

Shimatsu et al. (45) Date of Patent: Mar. 24, 2026

(54) METHOD FOR ATOMIC DIFFUSION BONDING AND BONDED STRUCTURE

(71) Applicants: TOHOKU UNIVERSITY, Sendai (JP); Canon Anelva Corporation, Kawasaki (JP)

(72) Inventors: Takehito Shimatsu, Sendai (JP); Miyuki Uomoto, Sendai (JP); Kazuo Miyamoto, Saitama (JP); Yoshikazu Miyamoto, Saitama (JP); Nobuhiko Katoh, Kawasaki (JP); Takayuki Moriwaki, Kawasaki (JP); Takayuki Saitoh, Kawasaki (JP)

(73) Assignees: TOHOKU UNIVERSITY, Sendai (JP); CANON ANELVA CORPORATION, Kawasaki (JP)

( * ) Notice: Subject to any disclaimer, the term of this patent is extended or adjusted under 35 U.S.C. 154(b) by 568 days.

(21) Appl. No.: 18/046,662

(22) Filed: Oct. 14, 2022

(65) Prior Publication Data

US 2023/0083722 A1 Mar. 16, 2023

Related U.S. Application Data

(63) Continuation of application No. PCT/JP2021/019853, filed on May 25, 2021.

(30) Foreign Application Priority Data

Jun. 1, 2020 (JP) ................................ 2020-095730

(51) Int. Cl.
*H01L 23/00* (2006.01)
*B32B 7/12* (2006.01)
(Continued)

(52) U.S. Cl.
CPC ................ *H01L 24/83* (2013.01); *B32B 7/12* (2013.01); *B32B 9/04* (2013.01); *B32B 37/12* (2013.01);
(Continued)

(58) Field of Classification Search
CPC ............. C04B 37/045; C04B 2237/08; C04B 2237/34; C04B 2237/341; C04B 2237/36;
(Continued)

(56) References Cited

U.S. PATENT DOCUMENTS

2012/0280367 A1* 11/2012 Logiou ............. H01L 21/76254
257/E29.022
2014/0130319 A1 5/2014 Iwamoto
(Continued)

FOREIGN PATENT DOCUMENTS

JP 2005104810 A 4/2005
JP 2012223792 A * 11/2012
(Continued)

OTHER PUBLICATIONS

English translation of JP-2012223792-A (Year: 2012).*
(Continued)

*Primary Examiner* — William B Partridge
*Assistant Examiner* — David Paul Sedorook
(74) *Attorney, Agent, or Firm* — BUCHANAN INGERSOLL & ROONEY PC

(57) ABSTRACT

Atomic diffusion bonding is carried out using a bonding film comprising a nitride formed at a bonding surface. Operating in a vacuum chamber, a bonding film comprising a nitride is formed on each of flat surfaces of two substrates that each have the flat surface, and, by overlapping the two substrates so the bonding films formed on the two substrates are in
(Continued)

contact with each other, the two substrates are joined by the generation of atomic diffusion at a bonding interface between the bonding films.

30 Claims, 5 Drawing Sheets

(51) Int. Cl.
| | |
|---|---|
| *B32B 9/04* | (2006.01) |
| *B32B 37/12* | (2006.01) |
| *C23C 14/06* | (2006.01) |
| *C23C 14/24* | (2006.01) |

(52) U.S. Cl.
CPC .......... *C23C 14/0641* (2013.01); *C23C 14/24* (2013.01); *H01L 24/32* (2013.01); *B32B 2255/20* (2013.01); *H01L 2224/32145* (2013.01); *H01L 2224/83896* (2013.01)

(58) Field of Classification Search
CPC ................ C04B 37/005; C04B 37/025; H01L 2224/80896; H01L 21/02002; H01L 21/2007; H01L 24/80; H01L 21/185; C23C 16/303; B23K 20/22; B23K 15/06; B23K 2101/40
See application file for complete search history.

(56) References Cited

U.S. PATENT DOCUMENTS

| | | | | |
|---|---|---|---|---|
| 2014/0291282 A1* | 10/2014 | Bedell | ................. | H01L 21/6835 |
| | | | | 216/2 |
| 2014/0312424 A1* | 10/2014 | Brawley | ........... | H01L 21/76262 |
| | | | | 438/479 |
| 2017/0372965 A1* | 12/2017 | Nishibayashi | ..... | H10D 62/8303 |
| 2020/0013765 A1* | 1/2020 | Fountain, Jr. | ....... | H01L 21/4803 |

FOREIGN PATENT DOCUMENTS

| | | | |
|---|---|---|---|
| JP | 5401661 | B2 | 1/2014 |
| JP | 2014123514 | A | 7/2014 |
| JP | 2016087664 | A | 5/2016 |
| JP | 2017022056 | A | 1/2017 |
| JP | 6089162 | B2 | 3/2017 |

OTHER PUBLICATIONS

The extended European Search Report issued Jul. 18, 2024, by the European Patent Office in corresponding European Patent Application No. 21816809.4-1211. (11 pages).
International Search Report (PCT/ISA/210) with English translation and Written Opinion (PCT/ISA/237) mailed on Aug. 10, 2021, by the Japanese Patent Office as the International Searching Authority for International Application No. PCT/JP2021/019853.

* cited by examiner

METHOD FOR ATOMIC DIFFUSION BONDING AND BONDED STRUCTURE

FIELD OF THE INVENTION

The present invention relates to an atomic diffusion bonding method and a bonded structure having a bonded portion bonded by the atomic diffusion bonding method, and more specifically to an improved atomic diffusion bonding method in which a bonding film including a nitride formed in a vacuum vessel on the bonding surface of one of the base materials to be bonded is overlaid with a bonding film formed on the other base material or on the bonding surface of the other base material to cause atomic diffusion for bonding, and to a bonded structure having a bonded portion bonded by this improved atomic diffusion bonding method.

BACKGROUND OF THE INVENTION

Bonding techniques that bond two or more materials to be bonded are used in various fields, and such bonding techniques are used for, for example, wafer bonding and package sealing in the field of electronic components.

Taking the above-described wafer bonding technique as an example, the related-art general wafer bonding technique is to apply high pressure and high heat between superimposed wafers to bond them.

However, this method of bonding cannot be used to bond or integrate substrates provided with electronic devices that are sensitive to heat or pressure. Therefore, there is a need for a technique to bond the base materials to be bonded without physical damage such as heat or pressure.

As one of such bonding techniques, a bonding method called "atomic diffusion bonding method" has been proposed.

In this atomic diffusion bonding method, a thin film (hereinafter referred to as the "bonding film") of metal or semi-metal with a thickness of the nano-order and a micro-crystalline or amorphous structure (hereafter referred to as "microcrystalline" including amorphous) is formed on a smooth surface of one of the wafers, chips, substrates, packages, or other various materials (hereinafter referred to as "base material") to be bonded by a vacuum deposition method such as sputtering or ion plating, and the thin film is overlaid with a bonding film formed on a smooth surface of the other base material or on a smooth surface of a base material with a microcrystalline structure in the same vacuum as that used to form the bonding film, or under atmospheric pressure, thereby allowing bonding with atomic diffusion at the bonding interface and grain boundaries (see Patent Literatures 1 and 2).

The atomic diffusion bonding method can be used to bond any materials to be bonded that allow the formation of the above-described bonding film in a vacuum. Therefore, the method has a wide range of applications, such as bonding not only semiconductor and ceramic wafers, but also metals, ceramic blocks (base materials), polymers, and various other materials, and bonding the same materials as well as different materials without heating, preferably at room (or low) temperature.

In the above-described atomic diffusion bonding method, bonding using an oxide or nitride bonding film was considered impossible, but the inventors of the present invention have succeeded in bonding using an oxide thin film as a bonding film, and have already filed a patent application (Japanese Patent Application No. 2019-162065).

There is a literature, although it does not disclose technology related to the "atomic diffusion bonding method" and describes the so-called "surface activation bonding method," that describes a surface activation bonding method in which inorganic adhesive layers are formed on the bonding surfaces of the base materials to be bonded, and the surfaces of the inorganic adhesive layers are activated by ion beam irradiation or other means, and then the base materials are bonded through the inorganic adhesive layers by overlaying the inorganic adhesive layers with each other. The literature also mentions the use of oxides and nitrides as materials for the above-described inorganic adhesive layers (Abstract, Claims 1 and 23, FIG. 3, and others of Patent Literature 3).

RELATED ART LITERATURES

Patent Literature

[Patent Literature 1] Japanese Patent No. 5401661
[Patent Literature 2] Japanese Patent No. 6089162
[Patent Literature 3] Japanese Patent KOKAI No. 2014-123514 (LOPI; automatically published after around 18 months from filing date regardless prosecution)

SUMMARY OF THE INVENTION

Problems to be Solved by the Invention

Atoms of a metal in the solid phase can hardly move at room temperature. However, in the above-described atomic diffusion bonding method, the high surface energy of a bonding film formed in a vacuum vessel is used as the driving force for bonding, and bonding is performed by moving the atoms of the materials constituting the bonding film at room temperature using the high atomic diffusion performance on the surface of the bonding film and, in some cases, the atomic rearrangement phenomenon at the contact interface.

The ease of atomic movement (atomic diffusion) in such a bulk material in the solid phase can be evaluated by the self-diffusion coefficient, where the higher the self-diffusion coefficient, the more easily atomic movement occurs, while the smaller the self-diffusion coefficient, the less easily atomic movement (atomic diffusion) occurs.

The dominant mechanism of atomic diffusion in the solid phase near room temperature is the movement of vacancies caused by crystal imperfections. The above-described atomic rearrangement is a phenomenon in which the atoms of a crystal are rearranged as a result of continuous vacancy movement. At the surface and grain boundaries of solids, atoms are extremely weakly constrained and the density of vacancies is large. Therefore, atomic diffusion at grain boundaries and interfaces is faster than bulk diffusion (body diffusion), and its diffusion coefficient is 10 to 20 orders of magnitude higher. In particular, microcrystalline films have a very high diffusion coefficient because the ratio of surface (grain boundaries) to the volume of solid phase (crystal grains) is very high (this high diffusion coefficient is important in atomic diffusion bonding using a thin metal film).

Therefore, in order to bond by the atomic diffusion bonding method, especially at room temperature, it is necessary to select a material with a self-diffusion coefficient high enough to enable atomic movement at room temperature as a bonding film material, so that materials with a high self-diffusion coefficient, such as Al or Ti, are often chosen as the material for the bonding film in atomic diffusion bonding. When a bonding film is formed from a material with a low self-diffusion coefficient at room temperature (as an example, a material with a self-diffusion coefficient of $1 \times 10^{-40}$ m²/s or less), a thin film with a small surface roughness is required to enhance diffusion by bringing many atoms into contact at the bonding interface, and in some cases, treatment such as heating during bonding to increase the self-diffusion coefficient may be necessary (paragraph [0018] of Patent Literature 1 and paragraph [0063] of Patent Literature 2).

Thus, a high self-diffusion coefficient is an important factor in selecting the bonding film material for the atomic diffusion bonding. However, oxides and nitrides of metals and half-metals such as $Al_2O_3$ and $Si_3N_4$ are chemically extremely stable materials known as high melting point ceramics, and their self-diffusion coefficient is much lower than those of metals and half-metals that constitute these oxides and nitrides. Therefore, they are known to be substances that are difficult to cause atomic movement, and it was recognized by the person skilled in the art that oxides and nitrides of metals and half-metals are not suitable as materials for the bonding film to be formed when bonding by the atomic diffusion bonding method.

In addition, even a bonding film (of metal or semiconductor) is deposited in a vacuum vessel, if it becomes chemically stable over time by reacting with impurity gases such as oxygen to form oxides etc., it cannot be bonded (paragraph [0070] of Patent Literature 1).

Therefore, in the atomic diffusion bonding method described in the above-described Patent Literature 1, the process from the deposition of a bonding film to bonding is performed in a vacuum vessel with a high degree of vacuum (claim 1, paragraph [0042] of Patent Literature 1). In addition, in the atomic diffusion bonding method described in Patent Literature 2, where the base materials are bonded together at atmospheric pressure, the bonding is performed under an inert gas atmosphere (claim 1 of Patent Literature 2) to prevent the bonding film from reacting with impurity gases such as oxygen.

In particular, the atomic diffusion bonding described in the above-described Patent Literature 2 stipulates that when nitrogen gas or a mixture of nitrogen gas and other inert gases is used as an inert gas, a material with a low free energy of formation of nitrides, that is, a material that is difficult to nitride, should be selected as the material of a bonding film (claim 9 of Patent Literature 2), and nitridation as well as oxidation of the bonding film is considered to be a cause of bonding failure (paragraph [0059] of Patent Literature 2).

Thus, in the case of Patent Literatures 1 and 2, even oxidation or nitridation that occurs during the short period of time between the formation of a bonding film and the bonding process is eliminated as much as possible, so the idea of introducing oxygen or nitrogen as a reactive gas into the vacuum vessel during the formation of the bonding film to cause oxidation or nitridation to form a bonding film including an oxide or nitride cannot arise from these literatures.

In addition, since atomic diffusion bonding cannot be performed with a bonding film that has been oxidized or nitrided, it is also considered by the person skilled in the art that an atomic diffusion bonding cannot be performed when a bonding film is formed from an oxide or nitride. The existence of such recognition by the person skilled in the art is supported by the fact that no examples of bonding by the atomic diffusion bonding method using a bonding film formed from an oxide or nitride have been reported before the filing of the present invention.

Thus, there has been no related-art atomic diffusion bonding method of bonding using a bonding film including an oxide or nitride.

On the other hand, depending on the application of bonding, it may be advantageous to form a bonding film from an oxide or nitride.

For example, a bonding film formed in atomic diffusion bonding is a thin film of a few angstroms, so even if they are made of metal, the bonding interface is nearly transparent and has almost no conductivity. However, since light is still absorbed by the metal bonding film at the bonding interface, albeit only by 1 to 2%, and a small amount of electrical conductivity remains, atomic diffusion bonding using a metal bonding film may not be applicable as a bonding method for high-brightness devices and electronic devices where even this small amount of remaining light absorption and conductivity is a problem.

In such a case, if a bonding film of an oxide such as $Al_2O_3$ (sapphire), which is insulating and transparent, can be used instead of a bonding film of a metal such as Al, the method can be used to bond objects that could not be bonded by the atomic diffusion bonding method in the past.

In some cases, such as when bonding insulating materials for heat dissipation for power devices, both insulation and thermal conductivity are required for bonding films.

In this case, $Al_2O_3$, an oxide of Al, meets the requirement in terms of insulation, but its thermal conductivity is as low as ⅙ of Al (see Table 1 below).

In contrast, AlN (aluminum nitride), a nitride of Al, has a thermal conductivity about four times higher than that of $Al_2O_3$ (sapphire) and has thermal conductivity close to that of Al. Therefore, in applications where both insulation and thermal conductivity are required, such as bonding insulating materials for heat radiation for power devices, it may be advantageous to perform atomic diffusion bonding using a nitride bonding film such as AlN.

TABLE 1

| Thermal conductivity of Al, Al oxide and nitride near room temperature | |
| --- | --- |
| Material | Thermal conductivity W/(m · k) |
| Pure Al | 236 |
| Al₂O₃(Sapphire) | 41 |
| AlN | 160 |

Furthermore, many oxides and nitrides have high hardness, excellent wear resistance, heat resistance, and other properties. If atomic diffusion bonding can be performed using a bonding film formed from an oxide or nitride, these properties can be added to bonding films, contributing to the development of new applications for the atomic diffusion bonding method.

The above-described Patent Literature 3 describes a surface activation bonding method in which inorganic adhesive layers are formed on the bonding surfaces of substrates to be bonded and the surfaces of the inorganic adhesive layers are activated by etching with ion beam irradiation or other means, and then bonded by overlaying them with each other. The literature also mentions the use of oxides such as silicon oxide ($SiO_2$) and aluminum oxide ($Al_2O_3$), and nitrides such as silicon nitride (SiNx), aluminum nitride (AlN), and titanium nitride (TiN) as materials for the inorganic adhesive layers (claim 23, paragraphs [0032] and [0059]).

However, there is a marked difference between the atomic diffusion bonding method, in which bonding films formed in a vacuum vessel can be bonded simply by overlaying them with each other without any other treatment, and the surface activation bonding method of Patent Literature 3, in which bonding is performed by activating the surfaces of the formed inorganic bonding layers through ion beam irradiation or other means. Therefore, contrary to the above-described recognition of the person skilled in the art, it cannot be predicted that inorganic adhesive layers including an oxide or nitride can be bonded by the atomic diffusion bonding method using oxide or nitride bonding films, just because the surface activated bonding method of Patent Literature 3 can be used to bond inorganic adhesive layers including an oxide or nitride.

In addition, due to the difference between the bonding methods, atomic diffusion bonding also has the advantage of reducing the number of processing steps because it does not require activation treatment.

In view of the advantages of using a bonding film formed from an oxide or nitride for the atomic diffusion bonding method, the inventors of the present invention first conducted a diligent study to explore the possibility of bonding by the atomic diffusion bonding method using a bonding film formed from an oxide.

As a result, it has been found that, contrary to the above-described recognition of the person skilled in the art, even in the case where bonding films are formed from an oxide, if they are formed as amorphous oxide films, bonding by chemical bonding can be caused by overlaying deposited bonding films with each other without surface activation treatment as is done in surface activated bonding (Japanese Patent Application No. 2019-162065 described above).

In other words, because the binding energy between elements such as metals and oxygen is high in oxides, atomic diffusion (movement) cannot be caused by forming a crystalline bonding film, but if the film has an amorphous structure, a thin film with many atomic defects, in which oxygen is missing or supersaturated compared to the stable stoichiometric composition, is formed. When the thin film is used, there are large fluctuations in the bonding state between the ions of elements such as metals and oxygen, which may have caused diffusion (movement) of atoms on the surface of the thin film, resulting in stable chemical bonds.

In view of the fact that, contrary to the recognition of the person skilled in the art, bonding could be performed using an oxide bonding film (amorphous oxide thin film), the inventors of the present invention considered that bonding with atomic diffusion can be performed even when using a bonding film of nitrides, which had been considered unsuitable as a bonding film material along with oxides.

In particular, nitrogen has lower electronegativity than oxygen, and as shown in Table 2 below, bond dissociation energy between nitrogen and other elements such as metals in nitrides is weaker than that between oxygen and other elements in oxides.

TABLE 2

| | Bond dissociation energy (kJ/mol, 25° C.) | | |
| Element | Bonding between same elements | Bonding with nitrogen | Bonding with oxygen |
| Al | 186(Al—Al) | 297(Al—N) | 512(Al—O) |
| Si | 327(Si—Si) | 439(Si—N) | 798(Si—O) |
| Ti | 141(Ti—Ti) | 464(Ti—N) | 662(Ti—O) |
| Y | 159(Y—Y) | 481(Y—N) | 715(Y—O) |

Thus, it was considered that there is a possibility that bonding with atomic diffusion can be performed even when using a bonding film of nitrides, which have a lower bond dissociation energy than oxides and, therefore, are more prone to atomic movement than oxides. Furthermore, it was considered that nitrides, which have low bond dissociation energy, can be bonded under more relaxed conditions, i.e., conditions similar to those when a metal or semi-metal bonding film is used, compared to those when an oxide bonding film is used.

Under the above prediction, the inventors of the present invention experimented with the atomic diffusion bonding method using a nitride bonding film, which had not been attempted for many years. They found, to their surprise and contrary to the long-held belief of the person skilled in the art, that atomic diffusion bonding, in which atomic diffusion occurs at the bonding interface, can be performed.

The present invention has been made as a result of the above-described points of view and experiments based thereon by the inventors, and provides an atomic diffusion bonding method using a nitride bonding film, which has not been employed as a bonding film for atomic diffusion bonding in the related art. As a result, an object of the present invention is to provide an atomic diffusion bonding method that can impart to a bonding film the characteristics of nitride thin films, such as insulation, thermal conductivity, high hardness, and wear resistance, and thus can be applied to objects and applications to which the bonding method could not be applied in the related art.

Means for Solving the Problem

In order to achieve the object, an atomic diffusion bonding method of the present invention comprises, in a vacuum vessel, forming a bonding film comprising a nitride on each of smooth surfaces of two base materials each having the smooth surface, and overlaying the two base materials with each other so that the bonding films formed on the two base materials are in contact with each other, thereby causing atomic diffusion at a bonding interface between the bonding films to bond the two base materials.

Another atomic diffusion bonding method of the present invention comprises, in a vacuum vessel, forming a bonding film comprising a nitride on a smooth surface of one base material, and overlaying the one base material with the other base material having a smooth surface with a nitride thin film at least on the surface so that the bonding film formed on the one base material contacts the smooth surface of the other base material, thereby causing atomic diffusion at a bonding interface between the bonding film and the smooth surface of the other base material to bond the two base materials.

Yet another atomic diffusion bonding method of the present invention comprises, in a vacuum vessel, forming a bonding film comprising a nitride on a smooth surface of one base material, and overlaying the one base material with the other base material having an activated smooth surface so that the bonding film formed on the one base material contacts the smooth surface of the other base material, thereby causing atomic diffusion at a bonding interface between the bonding film and the smooth surface of the other base material to bond the two base materials.

In any of the atomic diffusion bonding methods described above, it is preferable to cause atomic rearrangements associated with atomic diffusion at the bonding interface.

Furthermore, it is preferable that arithmetic mean roughness of the surface of the bonding films is 0.5 nm or less.

Moreover, the overlaying of the base materials may be performed without heating the base materials, and may be performed by heating the base materials when the base materials are overlaid at a temperature from room temperature to 400° C. to accelerate atomic diffusion.

It is preferable that the formation of the bonding film and/or the overlaying of the base materials may be performed in a vacuum vessel with an ultimate vacuum pressure of from $1\times10^{-3}$ Pa to $1\times10^{-8}$ Pa, and it is preferable that the formation of the bonding film and the overlaying of the base materials are performed in the same vacuum.

The bonding film may be formed from a nitride containing one or more elements selected from Groups 13 and 14 (B, Al, Si, Ga, Ge, In, Sn) of Period 2 to 5 of a periodic table, or, the bonding film may be formed from a nitride containing one or more elements selected from Groups 3 to 12 (Sc, Ti, V, Cr, Mn, Fe, Co, Ni, Cu, Zn) of Period 4 of a periodic table, and Groups 3 to 6 (Y, Zr, Nb, Mo, lanthanides, Hf, Ta) of Period 5 and 6 of a periodic table.

Furthermore, a film thickness of the bonding film may be from 0.3 nm to 5 μm.

Moreover, a bonded structure of the present invention comprises:

a first base material;

a second base material placed opposite to the first base material; and an intermediate layer provided between the first base material and the second base material and comprising a first bonding film comprising a nitride laminated on the first base material and a second bonding film comprising a nitride laminated on the second base material, the bonded structure having an interface where atomic diffusion has occurred between the first bonding film and the second bonding film of the intermediate layer.

Another bonded structure of the present invention comprises:

a first base material;

a second base material placed opposite to the first base material; and an intermediate layer provided between the first base material and the second base material and comprising a bonding film comprising a nitride laminated on the first base material, the bonded structure having an interface where atomic diffusion has occurred between the intermediate layer and the second base material.

A thickness of the intermediate layer of the bonded structure may be from 0.3 nm to 10 μm.

Furthermore, a material constituting the nitride in the intermediate layer may be different from a material constituting the first base material or the second base material.

Effect of the Invention

The configuration of the present invention described above has enabled us to provide an atomic diffusion bonding method using a nitride thin film deposited in a vacuum vessel as a bonding film.

In this bonding method, bonding can be performed by overlaying bonding films deposited in a vacuum vessel with each other as-deposited state. Therefore, unlike the surface activation bonding, in which bonding is performed by bringing surfaces activated by surface activation treatment into contact with each other, this method does not require any other treatment such as ion beam irradiation to activate the surface of the bonded film after deposition.

By bonding using a nitride bonding film in this way, the properties of the nitride, such as insulation, high heat transfer, high hardness, and wear resistance, could be imparted to the bonding film in the bonded portion.

As a result, in bonding insulating materials for heat dissipation in power devices, for example, it was possible to provide a bonding film with both insulation and thermal conductivity, properties that cannot be obtained with, for example, an Al bonding film, by forming the bonding film with AlN, which is a nitride of Al.

Here, in the case of bonding using a bonding film formed from an oxide, the bonding film must have an amorphous structure.

In contrast, in the atomic diffusion bonding method of the present invention, which is performed by forming a nitride bonding film, the bonding film is not limited to those with an amorphous structure. This method can bond even those with a crystalline structure, and depending on the type of nitride used, atomic rearrangements could be generated at the bonding interface, resulting in extremely strong bonding.

In nitrides, the binding energy between nitrogen and metal or semi-metal elements is higher than that between similar metals (see Table 2 above), although not as high as that of oxides, so that diffused atoms are immediately trapped by nearby atoms of different species, resulting in a short range of movement and making it difficult to bond with atoms located at a distance.

Therefore, if the surface of a bonding film is rough and there is even a small gap at the bonding interface, bonding cannot occur because atomic diffusion does not occur in this area, and even if it could, the bonding strength would be low.

However, in the configuration where the arithmetic mean roughness of a bonding film was 0.5 nm or less, the film surfaces were able to contact each other over the entire area at the atomic level during bonding, resulting in a strong atomic diffusion bonding.

In the atomic diffusion bonding method of the present invention, bonding can be performed without heat treatment after bonding, and bonding can be performed without heating, allowing bonding of base materials with different coefficients of thermal expansion.

In addition, heat treatment at 400° C. or lower after bonding further promoted atomic diffusion at the bonding interface, resulting in an even stronger bond.

EMBODIMENTS FOR CARRYING OUT THE INVENTION

Figure 1A:
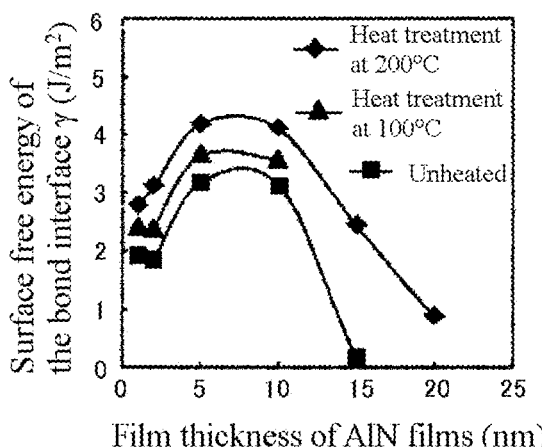
FIG. 1A shows a graph of the measurement results of the bonding strength of quartz wafers and FIG. 1B shows a graph of the variation of surface roughness Sa with respect to the thickness of the AlN bonding films in an atomic diffusion bonding test using AlN bonding films.

The atomic diffusion bonding method of the present invention is described below.

[Overview of Bonding Method]

The atomic diffusion bonding method of the present invention includes atomic diffusion bonding using a nitride thin film, which is formed by vacuum deposition such as sputtering or ion plating in a vacuum vessel, as a bonding film. In the method, the nitride bonding films formed on the smooth surfaces of two base materials to be bonded are overlaid with each other;

the nitride bonding film formed on the smooth surface of one base material to be bonded is overlaid with the smooth surface of the other base material, which has a nitride film at least on its surface; furthermore, the nitride bonding film formed on the smooth surface of one base material to be bonded is overlaid with the smooth surface of the other base material having an activated smooth surface, thereby causing atomic diffusion at the bonding interface to bond the base materials.

[Base Material (Material to be Bonded)]

(1) Material

The base material to be bonded by the atomic diffusion bonding method of the present invention may be any material on which the above-described nitride bonding film can be formed by sputtering, ion plating, or the like in a high vacuum atmosphere using a vacuum vessel with an achieved degree of vacuum of from $1 \times 10^{-3}$ to $1 \times 10^{-8}$ Pa, preferably from $1 \times 10^{-4}$ to $1 \times 10^{-8}$ Pa, as an example. In addition to various pure metals and alloys, semiconductors such as Si substrates and $SiO_2$ substrates, glass, ceramics, resins, oxides, nitrides, and others that can be vacuum-deposited using the above method may be used as the base materials (materials to be bonded) in the present invention.

The base materials may be bonded not only between the same material, such as metal to metal, but also between different materials, such as metal and ceramics.

(2) State and Other Properties of Bonding Surface

The shape of the base material is not particularly limited, and may be any shape from a flat plate to various complex three-dimensional shapes, depending on the application and purpose. However, the part to be bonded with the other base material (bonding surface) must have a smooth surface formed with a predetermined accuracy.

A plurality of base materials may be bonded to one base material by providing a plurality of smooth surfaces to be bonded on one base material.

The smooth surface is formed to surface roughness that enables the surface roughness of the formed bonding film to be 0.5 nm or less in arithmetic mean height Sa (ISO 4287) when the nitride bonding film described below is formed on this smooth surface. When the smooth surface is overlaid with the bonding film after surface activation, the smooth surface of the base material itself is formed with an arithmetic mean height Sa of 0.5 nm or less.

It is preferable that the gas adsorption layer, natural oxidation layer, or other altered layers are removed from the smooth surface of the base material before a bonding film is formed. For example, the above-described altered layer can be removed by a known wet process such as washing with chemicals, and after the removal of the above-described altered layer, a base material that has been hydrogen-terminated to prevent gas adsorption again can be suitably used.

The removal of the altered layer is not limited to the wet process described above, but may also be performed by a dry process, and the altered layer such as the gas adsorption layer and natural oxidation layer can be removed by reverse sputtering or other means through bombarding with rare gas ions in a vacuum vessel.

In particular, when the altered layer is removed by a dry process as described above, in order to prevent gas adsorption and oxidation on the surface of the base material until a bonding film is formed after the removal of the altered layer, it is preferable to perform the removal of the altered layer in the same vacuum as that used to form the bonding film, and to form the bonding film following the removal of the altered layer, and it is more preferable to remove the altered layer using an ultra-pure inert gas to prevent the re-formation of an altered layer by oxidation or the like after the removal of the altered layer.

The structure that can be bonded to the base material is not particularly limited and various structures can be bonded to the base material, including single crystal, polycrystalline, amorphous, and glassy structures. When the bonding film described below is formed on only one of the two base materials and the other base material is bonded without forming a bonding film, the bonding surface of the other base material without the bonding film must be either formed in advance with a nitride thin film, preferably of microcrystalline or amorphous structure on at least the surface so that atomic diffusion occurs, or activated by introducing the base material, whose surface has been hydrophilically treated outside the vacuum vessel, into the vacuum vessel, or by removing the oxidized and contaminated layers on the base material surface by dry etching in the same vacuum as that used to form the bonding film.

[Nitride Bonding Film]

(1) Material (1-1) General Information about Materials

Almost all nitrogen and more positive elements are known to form nitrides, with the exception of rare gases and some platinum group elements. Among these nitrides, as long as the nitrides are stable in vacuum and in air, they can be used as materials for the bonding film used in the atomic diffusion bonding of the present invention.

Such stably existing nitrides include nitrides containing Group 13 and 14 elements and nitrides containing transition metals, both of which can be used as a bonding film in the present invention.

When the above-described nitride bonding film is formed on both one and the other base materials, the materials of the bonding film formed on one base material and the bonding film formed on the other base material may be different.

(1-2) Nitrides Containing Group 13 and 14 Elements

Examples of nitrides containing Group 13 and 14 elements, one of the above-described nitrides, include nitrides containing one or more elements selected from Group 13 and 14 elements (B, Al, Ga, In, C, Si, Ge, Sn) of Period 2 to 5 in a periodic table, such as compounds of these elements and nitrogen (N), and nitrides such as BN, AlN, and $Si_3N_4$ are examples of these.

Compounds of these two or more elements and nitrogen may also be used for bonding. For example, it is known that (Al—Si)N, in which a part of Al in AlN is replaced by Si, can achieve great hardness while maintaining the excellent thermal conductivity of AlN.

These nitrides have strong covalent bonding properties, easily form compounds that follow the valence law, and have unique thermal and mechanical properties, making them suitable for a wide range of applications as functional materials.

In particular, AlN and $Si_3N_4$ are used for insulating heat-dissipating substrates because they have thermal conductivity close to that of metals despite being electrically insulating materials.

(1-3) Nitrides Containing Transition Metals

Examples of nitrides containing transition metals, which are the other nitrides described above, include one or more elements selected from elements in Groups 3 to 12 (Sc, Ti, V, Cr, Mn, Fe, Co, Ni, Cu, Zn) of Period 4 of the periodic table, elements in Groups 3 to 6 [Y, Zr, Nb, Mo, lanthanides (La, Ce, Pr, Nd, Pm, Sm, Eu, Gd, Td, Dy, Ho, Er, Tm, Yb, Lu), Hf, Ta, and W] of Periods 5 and 6 of the periodic table, such as TiN, CrN, MnN, and $Fe_3N$, which are compounds of these elements and nitrogen (N).

Most of the transition metal nitrides are interstitial compounds, which are produced by the intrusion of nitrogen atoms into the metal lattice, and can also be nitrides of alloys in which the original metal lattice is composed of two or more elements. Examples thereof include Ti—Zr—N and Fe—Cr—N.

Among these, TiN and CrN and the like have high hardness, excellent wear resistance and heat resistance, and are widely used as coating materials.

These nitrides are interstitial compounds, which are produced by the intrusion of nitrogen atoms into the metal lattice, and some of their compositions do not follow valence and have non-stoichiometric chemical formulae.

(2) Structure of Bonding Film

The composition of the elements forming a bonding film may be uniform in the thickness direction or in the in-plane direction. Alternatively, the bonding film may be a composition modulated film that varies in the thickness direction or in the in-plane direction, or may have a multilayer structure.

In particular, since nitrides of transition metals such as TiN and CrN take the form of interstitial compounds as described above, the bonding state with nitrogen can be easily adjusted by adjusting the amount of nitrogen introduced as a reactive gas when depositing a film by, for example, reactive sputtering. These nitrides can be continuously varied from metallic properties to nitride properties, for example, in the direction of film thickness, and may be used to form such a nitrogen composition modulated film or a bonding film with a multilayer structure.

Thus, nitride films that do not contain nitrogen in a part of the film thickness direction or that lack nitrogen bonding state can also be included in the bonding film in the present invention.

The above-described bonding film formed by these nitrides may be either crystalline or amorphous, but preferably has a microcrystalline or amorphous structure where atomic diffusion can easily occur. In particular, amorphous thin films can form nitride films in a non-equilibrium state even if the composition cannot be formed in a crystalline state, which also makes it possible to obtain a state in which atoms move easily.

Although the density of a bonding film at the bonding interface may decrease after bonding compared to the density of a bonding film before bonding, such a decrease in density is not a problem in application as long as the bonding strength is sufficient for engineering purposes.

The composition of the nitride bonding film described above is determined from the viewpoint of engineering applications, and the film may be selected to have the physical properties required in the field of application.

As an example, if the bonding is to be used for applications requiring heat conduction between the base materials to be bonded, a nitride having a high thermal conductivity should be selected as the nitride that constitutes the bonding film. If the bonding is to be used for bonding electronic devices using radio waves, ultrasound, or the like, a nitride with appropriate hardness, electromechanical coefficient, and other properties is used to form a bonding film.

(3) Surface Roughness of Bonding Film

In order to obtain a strong bond at the interface between the bonding films to be bonded and at the interface between the bonding film and the surface of the other base material, atoms must diffuse to a certain extent at the bonding interface.

In order for atoms to move at the contact interface and bond with sufficient strength, atomic diffusion at the bonding interface should be equivalent to that of the unit cell of the crystalline structure, and the surface roughness at the contact interface is preferably equal to or less than that.

Table 3 below shows the crystal structures and lattice constants of typical nitrides.

The major axis length of typical nitrides such as AlN is about 0.5 nm. The surface roughness at the contact interface is 0.5 nm or less in terms of arithmetic mean roughness [arithmetic mean height Sa (ISO 4287)], preferably sufficiently 0.5 nm or less, and more preferably 0.3 nm or less, which is the lower limit of the numerical range of the above lattice constant, to ensure that the bonding interface is contacted at the atomic level.

TABLE 3

| Lattice constants of typical nitrides | | | | |
|---|---|---|---|---|
| Composition | AlN | GaN | TiN | ZrN |
| Crystal Structure | Hexagonal (wurtzite) | Hexagonal (wurtzite) | Tetragonal | Tetragonal |
| Lattice constant (nm) | a = 0.311 c = 0.498 | a = 0.318 c = 0.517 | a = 0.425 | a = 0.454 |

(4) Deposition Method

The deposition method of a bonding film is not limited to the vacuum deposition method that can form a nitride thin film as a bonding film on a smooth surface of a base material in a vacuum, and various known methods may be used to form the film.

The bonding performance can be improved by controlling the nitrogen defects and supersaturated nitrogen in the bonding film to be formed to increase the defects inside the film and increase the atomic mobility. The sputtering method, which is easy to control these defects, and the vapor deposition method using nitrogen plasma (nitrogen radical) can be suitably employed as the deposition method of a bonding film.

In addition, these deposition methods may be employed so that only a few atomic layers of the surface layer of a bonding film are in such a defect-rich state.

When a bonding film is formed by sputtering or evaporation combined with nitrogen plasma (nitrogen radical), the nitride bonding film may be deposited by sputtering a nitride target or by evaporating a nitride solid. Alternatively, a bonding film may be deposited by the reactive sputtering method, in which a target including a nitride-forming element such as Al, Si, or Ti is sputtered and reacted with nitrogen introduced into the vacuum vessel as a reactive gas to form a bonding film which is nitride, or other method.

In general, when a bonding film is formed by sputtering or vapor deposition, the surface roughness increases as the film thickness increases, while the increase in the surface roughness of the bonding film decreases the bonding strength as mentioned above.

Therefore, in order to suppress the increase in surface roughness of the bonded film, the energy treatment sputtering (ETS) method, which performs sputtering deposition and ion etching simultaneously, can be used to form a thick nitride film while maintaining a small surface roughness. Therefore, this deposition method is suitable for forming a bonding film, especially for bonding films that require a relatively thick film thickness.

In film deposition using the ETS method, even when the surface roughness of the base material is large, a bonding film can be formed into a thick film with a small surface roughness. This eliminates the need for high-precision polishing of the base material surface when bonding, thereby eliminating some of the complicated processes and providing other significant industrial advantages.

(5) Degree of Vacuum

Oxygen, water, and impurity gases such as carbon that exist as impurities in the vacuum vessel during the formation of a bonding film are incorporated into the nitride film to be formed and degrade the physical properties of the bonding film.

In addition, adsorption of oxygen, water and impurity gases such as carbon present as impurities in the vacuum vessel on the surface of the formed bonding film stabilizes the chemical state of the surface and inhibits the interdiffusion of atoms between bonding films at the bonding interface.

Therefore, the achieved degree of vacuum of the vacuum vessel must be higher than $10^{-3}$ Pa, which is equal to or less than one hundredth of $10^{-1}$ Pa, where the mean free path of residual gas is equal to the size of the vacuum vessel.

In order to suppress gas adsorption on the surface of a bonding film, thin film formation and bonding are performed preferably in a vacuum environment better than $10^{-4}$ Pa, which is equivalent to 1 Langmuir, and more preferably and ideally in an ultra-high vacuum environment of $10^{-6}$ Pa or less while the purity of additive gases such as argon and nitrogen is maintained as necessary.

(6) Thickness of Bonding Film to be Formed

For a bonding film to have the physical properties of the nitride included in it, it must be at least as thick as the lattice constant, which must be 0.3 nm or more.

On the other hand, when a bonding film is to have insulating properties, a thick film may be required from the viewpoint of breakdown voltage.

In this case, increasing the film thickness using a general deposition method increases the surface roughness and degrades the bonding performance. Therefore, the above-described ETS method is useful for forming a nitride thin film with small surface roughness.

However, since a very long deposition time is required to form a bonding film of 5 μm or more, making it difficult to deposit the film industrially, the thickness of the nitride thin film is preferably from 0.3 nm to 5 μm, and more preferably from 0.5 nm to 1 μm.

(7) Others

In the atomic diffusion bonding method of the present invention, bonding may also be performed by forming a bonding film only on the smooth surface of one base material to be bonded, and overlaying the smooth surface of the one base material on which the bonding film has been formed with an activated smooth surface of the other base material.

In such a bonding method, the activation of the smooth surface of the other base material may be performed by introducing the base material whose smooth surface has been hydrophilically treated outside the vacuum vessel into the vacuum vessel, or by removing the oxidized or contaminated layer on the smooth surface of the other base material by dry etching or other means in the same vacuum as that used to form the bonding film.

The material of the other base material is not limited to a nitride, but may be an oxide, Si, or other semiconductors, as long as the base material is activated and the surface can be in a state where atomic diffusion can easily occur through contact with the above-described bonding film.

By using this bonding method, where the bonding film is formed only on the smooth surface of one of the base materials, the bonding film can also be used for electrical insulation between the base materials to be bonded or for adjusting the optical characteristics between the base materials.

EXAMPLES

The following is a description of bonding tests performed by the atomic diffusion bonding method of the present invention.

(1) Test Example 1 (Bonding Using AlN Thin Films as Bonding Films)

(1-1) Experimental Method

As an example of the bonding test using a bonding film formed by nitrides of Group 13 elements among the above-described nitrides, AlN thin films were used for bonding by the atomic diffusion bonding method of the present invention.

Bonding was performed between 2-inch diameter quartz wafers and between 2-inch diameter Si wafers. The surface roughness of the bonding surface of the quartz wafers was 0.16 nm in terms of arithmetic mean height Sa (ISO 4287), and the surface roughness of the bonding surface of the Si wafers was 0.14 nm in terms of arithmetic mean height Sa.

In order to form the bonding films, a pair of wafers to be bonded were set in a vacuum vessel with an achieved degree of vacuum of $1 \times 10^{-6}$ Pa or less, and AlN thin films were formed as the bonding films on the bonding surfaces of the wafers using RF magnetron sputtering.

After an AlN thin film was formed as a bonding film on each of the two wafers, the bonding films formed on the two wafers were overlaid with each other in the same vacuum for 10 seconds at a pressure of approximately 1 MPa without heating to bond the two wafers.

For bonding of quartz wafers and bonding of Si wafers, the thickness of the bonding films was set to 1, 2, 5, 10, 15, and 20 nm per side in this order, and the change in the surface roughness of the AlN thin films (before bonding) with respect to the change in film thickness was measured using an atomic force microscope (AFM). Along with this, after bonding the wafers using the AlN thin films at various film thicknesses, samples were prepared without heating and with heat treatment in air at 100° C. and 200° C. for 5 minutes.

The magnitude of the bonding strength (surface free energy of the bond interface) γ was measured by the "blade method" for each sample bonded under each of the above bonding conditions.

Figure 6:
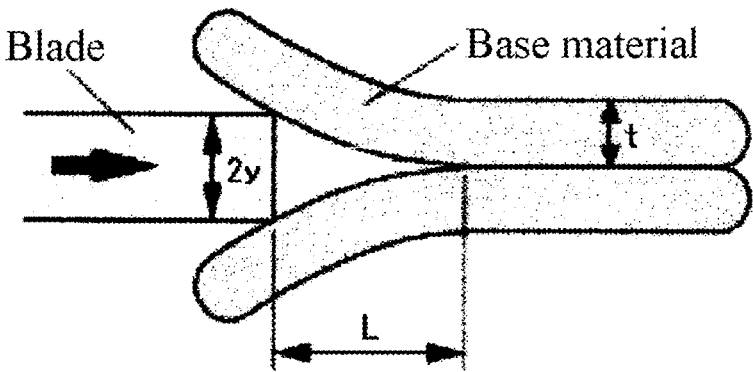
FIG. 6 shows the method of measuring bonding strength using the blade method.

The "blade method" evaluates the bonding strength (surface free energy at the bonding interface) γ based on the peeling length L from the tip of the blade when the blade is inserted into the bonding interface of the two base materials, as indicated in FIG. 6, and the bonding strength γ is expressed by the following equation [M. P. Maszara. G. Goetz. A. Cavigila and J. B. McKitterick: J. Appl. Phys. 64 (1988) 4943]:

$$\gamma = \tfrac{3}{8} \times E t^3 y^2 / L^4$$

wherein E is the Young's modulus of the wafer, t is the thickness of the wafer, and y is ½ the thickness of the blade.

(1-2) Test Results (1-2-1) Bonding Strength Measurement Results

Figure 1B:
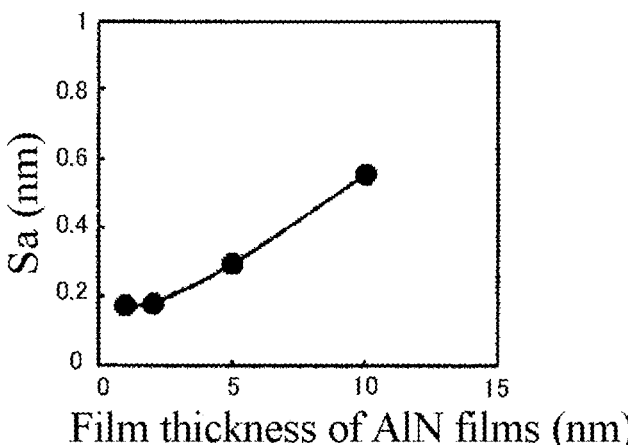

FIG. 1A shows the measurements of the bonding strength (free energy of bonding interface) γ of samples obtained by bonding quartz wafers (Sa=0.16 nm) to each other during the above bonding test, and FIG. 1B shows the change in the surface roughness Sa with respect to the change in the AlN thin film thickness.

The bonding strength γ exhibited a high value of approximately 2 J/m$^2$ after bonding, even in the unheated state and when the bonding film thickness was 1 nm and 2 nm, confirming that sufficient bonding strength γ had been obtained.

In the samples with bonding film thicknesses of 5 nm and 10 nm, the bonding strength γ exceeded 3 J/m$^2$ even in the unheated samples, indicating an increase in the bonding strength γ compared to the samples with bonding film thicknesses of 1 nm and 2 nm.

However, a decrease in bonding strength γ was observed when the film thickness was further increased than 10 nm.

On the other hand, the value of the surface roughness Sa increased with the increase in the film thickness, and this increase in the surface roughness is considered to be the cause of the decrease in the bonding strength γ when the film thickness was more than 10 nm. The samples that were heated after bonding showed an increase in bonding strength γ at both temperature conditions of 100° C. and 200° C. In a comparison of bonding films with a thickness of 1 nm, an increase in the bonding strength γ of approximately 1.25 times and 1.5 times was obtained by heating at 100° C. and 200° C., respectively, compared to the case without heating.

The bonding strength γ reached 4.2 J/m$^2$ at a film thickness of 5 nm when heating was performed at 200° C., indicating that extremely strong bonding was achieved.

Furthermore, an increase in bonding strength γ was also observed in samples with film thicknesses of 15 and 20 nm upon heat treatment.

Figure 2:
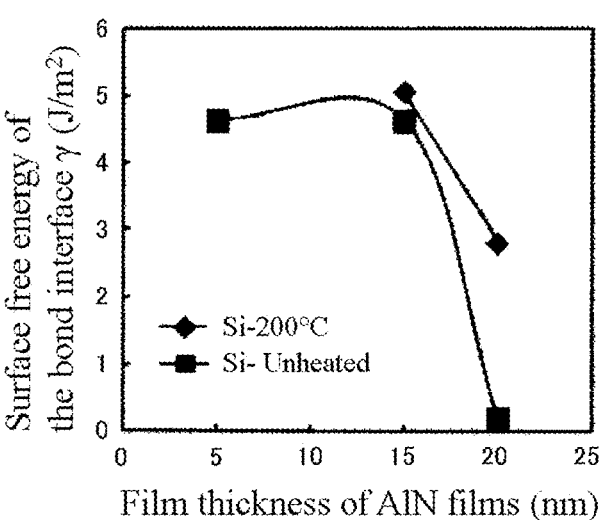
FIG. 2 shows a graph of the measurement results of the bonding strength of Si wafers in an atomic diffusion bonding test using AlN bonding films.

FIG. 2 shows the results of bonding Si wafers with a surface roughness Sa of 0.14 nm by the same method using AlN thin films of 5 nm and 15 nm thickness.

In the example of bonding Si wafers to each other, even higher bonding strength γ was measured than in the case of bonding quartz substrates, and the bonding strength γ reached 4.7 J/m$^2$ for the unheated samples bonded using either 5 nm or 15 nm thick bonding films.

After heat treatment at 200° C., the value was as high as 2.8 J/m$^2$ even at a film thickness of 20 nm.

From the above results, it has been confirmed that high bonding strength γ can be obtained in bonding of both quartz and Si wafer base materials using AlN thin films as bonding films with and without heating, regardless of the thickness of the bonding films.

(1-2-2) Result of Confirmation of Bonding State

Figure 3A:
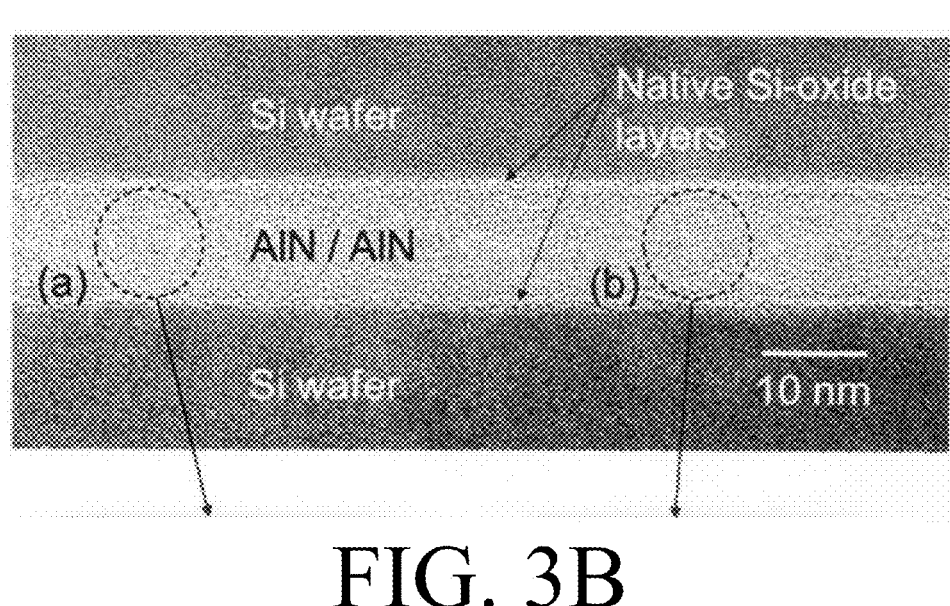
FIG. 3A shows a cross-sectional TEM image and FIG. 3B shows FFT diffraction results of Si wafers bonded by the atomic diffusion bonding method of the present invention (AlN bonding films).

FIG. 3A shows a cross-sectional TEM photograph of an unheated sample in which Si wafers (Sa=0.14 nm) were bonded to each other using AlN thin films having a film thickness of 5 nm per one side as bonding films.

In FIG. 3A, the layer between a Si wafer and a bonding film (AlN thin film) is the natural oxide layer of Si on the Si wafer surface.

In the cross section shown in FIG. 3A, the originally existing bonding interface between the two bonding films (AlN thin films) had completely disappeared, confirming that the bonding strength is high.

In the figure, the presence of crystal lattices is observed in the bonding films (AlN thin films), confirming that the bonding films (AlN thin films) are crystalline thin films.

Figure 3B:
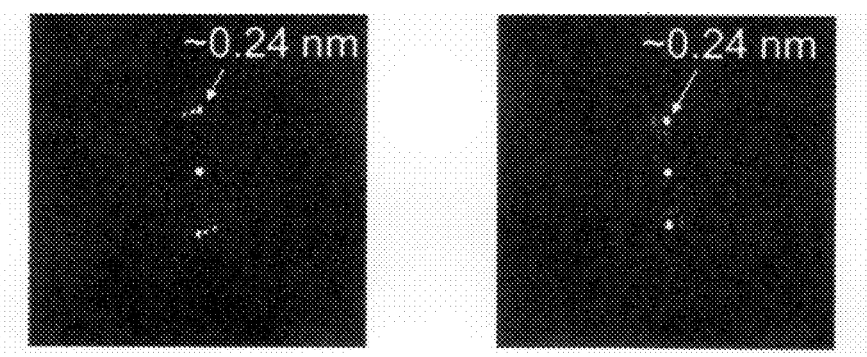

FIG. 3B shows the results of FFT analysis of the lattice images in the areas (a) and (b) surrounded by dashed circles in FIG. 3A.

FIG. 3B shows that in the bonding films (AlN thin films), the crystal lattice with a half face spacing of about 2.4 nm is oriented parallel to the film surface, and this measurement corresponds to the face spacing of the c-plane of aluminum nitride (AlN) with the hexagonal wurtzite structure (c=0.498 nm, see Table 3).

This indicates that the bonding films are AlN films with a hexagonal wurtzite crystal orientation, and that atomic rearrangement by atomic diffusion occurs at the contact interface between the bonding films.

(1-3) Consideration

The above results confirm that strong bonding with atomic diffusion can be achieved at room temperature even when nitride bonding films, which were considered to be unsuitable for atomic diffusion bonding in the related art, are used.

When an oxide bonding film is formed, it is necessary to make the bonding film to have an amorphous structure. In contrast, it has been confirmed that when a nitride bonding film is formed, bonding with atomic diffusion or bonding with recrystallization associated with atomic diffusion is possible even by forming a crystalline thin film, and that the atomic diffusion bonding method can be used for bonding under the same conditions as those when a bonding film was formed by a metal that has not been nitrided.

(2) Test Example 2 (Bonding Using BN Thin Films as Bonding Films)

(2-1) Test Method

Among the above-described nitrides, BN thin films, which are nitrides of Group 13 elements, were used for bonding by the atomic diffusion bonding method of the present invention.

Two 2-inch-diameter quartz wafers with the same surface roughness of the bonding surface as in Test Example 1 were bonded to each other in the same manner as in Test Example 1, except that the nitride of the bonding films to be formed were changed.

The thickness of the bonding films was set to 0.3, 0.5, 1, 2, and 5 nm per side in this order, and the change in the surface roughness of the BN thin film (before bonding) with respect to the change in film thickness was measured using an atomic force microscope (AFM). Along with this, after bonding the wafers, samples were prepared without heating and with heat treatment in air at 100° C., 200° C., and 300° C. for 5 minutes.

For each of the samples obtained above, the magnitude of the bonding strength (surface free energy at the bond interface) γ was measured and evaluated by the "blade method" as in Test Example 1.

(2-2) Test Results

The surface roughness Sa and bonding strength γ of each sample were measured, and the results are shown in Table 4.

TABLE 4

Surface roughness and bonding strength of BN thin films (Test Example 2)

| | | Film thickness (nm, per side) | | | | |
| --- | --- | --- | --- | --- | --- | --- |
| | | 0.3 | 0.5 | 1 | 2 | 5 |
| Surface roughness Sa (nm) | | 0.13 | 0.13 | 0.13 | 0.13 | 0.15 |
| γ (J/m$^2$) | Unheated | 0.16 | 0.09 | 0.09 | 0.11 | 0.10 |
| | After heat treatment at 100° C. | 0.28 | 0.30 | 0.35 | 0.30 | 0.35 |
| | After heat treatment at 200° C. | 0.37 | 0.49 | 0.69 | 0.48 | 0.49 |
| | After heat treatment at 300° C. | 0.51 | 0.69 | 0.69 | 0.57 | 0.69 |

(2-3) Consideration

The surface roughness Sa of the BN thin films were 0.13 nm at thicknesses of 0.3, 0.5, 1, and 2 nm, and slightly increased to 0.15 nm at a film thickness of 5 nm.

As in the test example using AlN thin films as bonding films, it has been confirmed that bonding can be performed also in the bonding test using BN thin films as bonding films.

In the sample using BN thin films as bonding films, the bonding strength γ in the unheated state was 0.16 J/m$^2$ at a film thickness of 0.3 nm and about 0.1 J/m$^2$ at other film thicknesses. Although the bonding strength γ was not as high as that of the sample using the AlN films as bonding films used in Test Example 1, it has been confirmed that bonding with atomic diffusion at the bonding interface is possible.

The bonding strength γ increased with heat treatment, and after heat treatment at 300° C., it increased to around 0.6 J/m$^2$, indicating that the bonding strength can be increased by heat treatment.

(3) Test Example 3 (Bonding Using Si$_3$N$_4$ Thin Films as Bonding Films)

(3-1) Test Method

Among the above-described nitrides, Si$_3$N$_4$ thin films, which are nitrides of Group 14 elements, were used for bonding by the atomic diffusion bonding method of the present invention.

In a state where 2-inch-diameter quartz wafers and 2-inch-diameter Si wafers included the bonding surface having the same surface roughness as in Test Example 1, bonding was performed between the 2-inch-diameter quartz wafers and between the 2-inch-diameter Si wafers in the same manner as in Test Example 1, except that the nitride of the bonding films to be formed was changed.

For both the bonding of quartz wafers and Si wafers, the thickness of the bonding films was set to 5 nm per side, and samples were prepared in the unheated state after bonding and after heat treatment at 100° C., 200° C., and 300° C. for 5 minutes in air.

For each of the samples obtained above, the magnitude of the bonding strength (surface free energy at the bond interface) γ was measured and evaluated by the "blade method" as in Test Example 1.

(3-2) Test Results

The measured bonding strength γ of each sample is shown in Table 5.

TABLE 5

Bonding strength of bonding with Si$_3$N$_4$ thin films (Test Example 3)

| | | Substrate (wafer) material | |
| --- | --- | --- | --- |
| | | Quartz | Si |
| Film thickness (mm, per side) | | 5 | 5 |
| γ (J/m$^2$) | Unheated | 0.40 | 0.33 |
| | After heat treatment at 100° C. | 0.57 | 0.52 |
| | After heat treatment at 200° C. | 0.81 | 1.02 |
| | After heat treatment at 300° C. | 1.21 | 1.53 |

Figure 4:
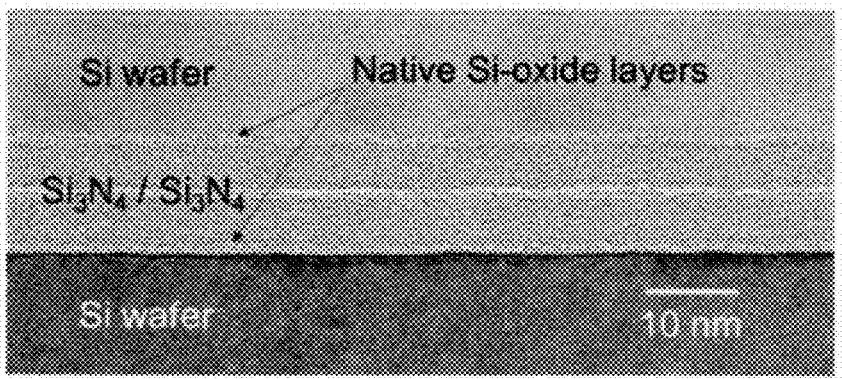
FIG. 4 shows a cross-sectional TEM image of Si wafers bonded by the atomic diffusion bonding method of the present invention ($Si_3N_4$ bonding films).

FIG. 4 shows a cross-sectional TEM photograph of a sample of Si wafers bonded using Si$_3$N$_4$ thin films with a thickness of 5 nm per side (after bonding and heat treatment at 300° C.).

(3-3) Consideration

As in the test example using AlN thin films as bonding films, it has been confirmed that both quartz and Si wafers can be bonded even in the bonding test using Si$_3$N$_4$ thin films as bonding films.

The bonding strength γ of the samples bonded using Si$_3$N$_4$ thin films as bonding films was 0.4 J/m$^2$ for bonding quartz wafers and 0.33 J/m$^2$ for bonding Si wafers in the unheated state. Although the bonding strength γ was not as high as that of the sample with the AlN film used as bonding films in Test Example 1, it has been confirmed that bonding with atomic diffusion at the bonding interface is possible.

The bonding strength γ increased with heat treatment, and after heat treatment at 300° C., it increased to 1.21 J/m$^2$ for bonding quartz wafers and 1.53 J/m$^2$ for bonding Si wafers, indicating that use in applications requiring high bonding strength is made possible by heat treatment.

In the TEM photograph in FIG. 4, there is a natural oxidation layer of Si on the Si substrate surface between the Si substrate and the Si$_3$N$_4$ thin film. In the figure, the bonding interface of the Si$_3$N$_4$ thin film appears brighter, indicating that the density of the bonding interface is lower than that inside the Si$_3$N$_4$ thin film, but there is no gap between the films.

No lattice fringes were observed in the Si$_3$N$_4$ thin film, and its structure was amorphous.

(4) Test Example 4 (Bonding Using TaN Thin Films as Bonding Films)

(4-1) Experimental Method

Among the above-described nitrides, the nitrides of transition metals (interstitial nitrides) were used to form bonding films. As an example of a bonding test using these nitrides, bonding was performed using TaN thin films as bonding films.

Two 2-inch-diameter quartz wafers with the bonding surface having the same surface roughness as in Test Example 1 were bonded to each other in the same manner as in Test Example 1, except that the bonding films to be formed were changed to TaN thin films.

The thickness of the bonding films was set to 2, 5, 10, 20, 30, and 50 nm per side in this order, and the change in the surface roughness of the TaN thin films (before bonding) with respect to the change in film thickness was measured using an atomic force microscope (AFM). Along with this, after bonding the wafers using the TaN thin films at various film thicknesses, samples were prepared without heating and with heat treatment in air at 100° C., 200° C., and 300° C. for 5 minutes.

The magnitude of the bonding strength (surface free energy of the bond interface) $\gamma$ was measured by the above-described "blade method" for each sample bonded under each of the above bonding conditions.

(4-2) Test Results

The measurement results of the surface roughness Sa and bonding strength $\gamma$ are shown in Table 6.

TABLE 6

Surface roughness and bonding strength of TaN thin films

|  |  | Film thickness (nm) | | | | | |
| --- | --- | --- | --- | --- | --- | --- | --- |
|  |  | 2 | 5 | 10 | 20 | 30 | 50 |
| Surface roughness Sa (nm) | | 0.14 | 0.15 | 0.15 | 0.16 | 0.16 | 0.19 |
| Bonding strength $\gamma$ (J/m²) | Unheated | Not measurable | Not measurable | 2.91 | 2.85 | 2.92 | 2.31 |
|  | 100° C. | Not measurable | Not measurable | 3.83 | 3.76 | 3.85 | 2.99 |
|  | 200° C. | Not measurable | Not measurable | 4.43 | 4.35 | Not measurable | 3.94 |
|  | 300° C. | Not measurable | Not measurable | Not measurable | 5.05 | Not measurable | 3.94 |

Figure 5:
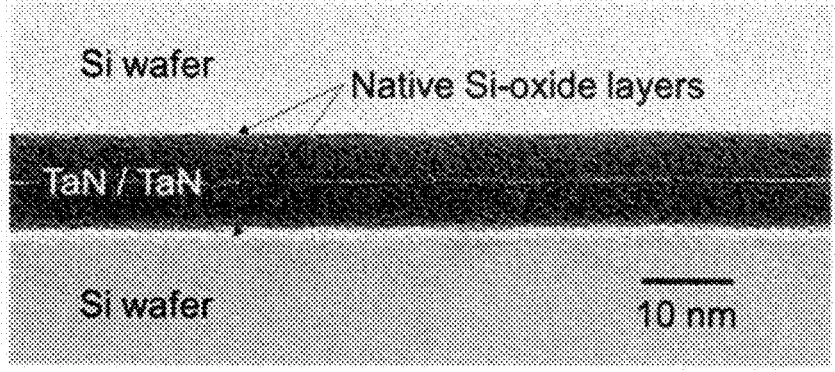
FIG. 5 shows a cross-sectional TEM image of Si wafers bonded by the atomic diffusion bonding method of the present invention (TaN bonding film).

FIG. 5 shows a cross-sectional TEM photograph of a sample (unheated) of Si wafers bonded with a 5-nm-thick TaN thin films.

(4-3) Consideration, Etc.

In the TaN film, the increase in the surface roughness Sa with the increase in the film thickness was small, remaining at 0.16 nm even at a film thickness of 30 nm, and 0.19 nm even at a film thickness of 50 nm.

The bonding strength $\gamma$ of the films with thicknesses of 2 nm and 5 nm enabled to achieve the bonding with the strength that cannot be already measured by the blade method in the unheated state (i.e., the bonding strength exceeds the breaking strength of the quartz wafers, which would cause the quartz wafers to break if the measurement is forced). The bonding strength $\gamma$ of the films with thicknesses of 10 nm, 20 nm, and 30 nm was close to 3 J/m² even when the films were unheated after bonding, and the bonding strength $\gamma$ increased with the increase in the heat treatment temperature.

At film thicknesses of 10 nm and 30 nm, high bonding strength (bonding strength exceeding the fracture strength of quartz), which could not be evaluated by the blade method, was obtained after heat treatment at 300° C. and 200° C. or higher.

Although the bonding strength $\gamma$ of the films with a thickness of 50 nm was lower than that of the films with a thickness of 30 nm or less, it was 2.31 J/m² even when the films were unheated, and reached 3.94 J/m² after heat treatment at 300° C.

As described above, in the bonding example using the TaN thin films, it has been confirmed that high-strength bonding is possible over a wide film thickness range of 2 to 50 nm. The reason for this is that the surface roughness Sa of the TaN thin films before bonding remains small even with an increase in the film thickness.

In the SEM image shown in FIG. 5, a white layer between a Si wafer and a TaN thin film is a layer of Si oxide generated on the Si wafer surface.

In the figure, the bonding interface between the TaN thin films appears brighter in some places, indicating that the density of the bonding interface is slightly lower than that inside the TaN thin films, but the bonding interface between the TaN thin films is bonded without gaps.

The TaN thin films had an amorphous structure. Since crystalline TaN has a hexagonal crystal structure which is an atom close-packed structure it can be assumed that the spatial density of atoms is maintained high even when it becomes amorphous and that the spatial density of atoms could lead the surface roughness Sa of the TaN thin films are kept low and the diffusion performance of atoms on the surface of the TaN thin films is kept high, by which leads an excellent bonding performance of the TaN thin films.

(5) Test Example 5 (Bonding Using TiN Thin Films as Bonding Films)

(5-1) Test Method

As an example of a bonding test using bonding films formed by the above-described transition metal nitrides (interstitial nitrides), bonding was performed using TiN thin films as bonding films.

Two 2-inch-diameter quartz wafers with the bonding surface having the same surface roughness as in Test Example 1 were bonded to each other in the same manner as in Test Example 1, except that the bonding films to be formed were changed to TiN thin films.

The thickness of the bonding films was set to 1 and 2 nm per side in this order, and the change in the surface roughness of the TiN thin films (before bonding) with respect to the change in film thickness was measured using an atomic force microscope (AFM). Along with this, after bonding the wafers using the TiN thin films at various film thicknesses, samples were prepared without heating and with heat treatment in air at 300° C. for 5 minutes.

The magnitude of the bonding strength (surface free energy of the bond interface) $\gamma$ was measured by the above-described "blade method" for each sample bonded under each of the above bonding conditions.

(5-2) Test Results

The measurement results of the surface roughness Sa and bonding strength $\gamma$ are shown in Table 7.

21

TABLE 7

| Surface roughness and bonding strength of TiN thin films | | Film thickness (nm) | |
| --- | --- | --- | --- |
| | | 1 | 2 |
| Surface roughness Sa (nm) | | 0.17 | 0.18 |
| Bonding | Unheated | 0.44 | 0.09 |
| strength | 300° C. | 0.63 | 0.45 |
| $\gamma$ (J/m$^2$) | | | |

(5-3) Consideration, Etc.

After bonding, the unheated bonding strength $\gamma$ of TiN thin films was 0.44 J/m$^2$ at 1 nm thickness, but decreased to 0.09 J/m$^2$ at 2 nm thickness.

The bonding strength $\gamma$ increased with heat treatment at 300° C. to 0.63 J/m$^2$ and 0.45 J/m$^2$ at film thicknesses of 1 nm and 2 nm, respectively.

TiN thin films have an amorphous structure, but the structure of crystalline TiN is a NaCl-type structure with low space density of atoms, and it is presumed that the space density of atoms is low even when amorphized. Therefore, it is presumed that the surface diffusion performance of atoms is lower than that of TaN which is a nitride of the same transition metal, and that the bonding performance is also lower.

What is claimed is:

1. An atomic diffusion bonding method comprising, in a vacuum vessel, forming a bonding film comprising a nitride with a microcrystalline or amorphous structure on each of smooth surfaces of two base materials each having the smooth surface, then, without performing any other treatment on the bonding films comprising the nitride with the microcrystalline or amorphous structure formed in the vacuum vessel, overlaying the two base materials with each other so that the bonding films formed on the two base materials are in contact with each other, thereby causing atomic diffusion at a bonding interface between the bonding films to bond the two base materials.

2. An atomic diffusion bonding method comprising, in a vacuum vessel, forming a bonding film comprising a nitride with a microcrystalline or amorphous structure on a smooth surface of one base material, then, without performing any other treatment on the bonding film comprising the nitride with the microcrystalline or amorphous structure formed in the vacuum vessel, overlaying the one base material with the other base material having a smooth surface with a nitride thin film with a microcrystalline or amorphous structure at least on the surface so that the bonding film formed on the one base material contacts the smooth surface of the other base material, thereby causing atomic diffusion at a bonding interface between the bonding film and the smooth surface of the other base material to bond the two base materials.

3. An atomic diffusion bonding method comprising, in a vacuum vessel, forming a bonding film comprising a nitride with a microcrystalline or amorphous structure on a smooth surface of one base material, then, without performing any other treatment on the bonding film comprising the nitride with the microcrystalline or amorphous structure formed in the vacuum vessel, overlaying the one base material with the other base material having an activated smooth surface so that the bonding film formed on the one base material contacts the smooth surface of the other base material, thereby causing atomic diffusion at a bonding interface between the bonding film and the smooth surface of the other base material to bond the two base materials.

4. The atomic diffusion bonding method according to claim 1, comprising causing atomic rearrangements associated with atomic diffusion at the bonding interface.

5. The atomic diffusion bonding method according to claim 2, comprising causing atomic rearrangements associated with atomic diffusion at the bonding interface.

6. The atomic diffusion bonding method according to claim 3, comprising causing atomic rearrangements associated with atomic diffusion at the bonding interface.

7. The atomic diffusion bonding method according to claim 1, wherein arithmetic mean roughness of the surface of the bonding films is 0.5 nm or less.

8. The atomic diffusion bonding method according to claim 2, wherein arithmetic mean roughness of the surface of the bonding films is 0.5 nm or less.

9. The atomic diffusion bonding method according to claim 3, wherein arithmetic mean roughness of the surface of the bonding films is 0.5 nm or less.

10. The atomic diffusion bonding method according to claim 1, wherein the overlaying of the base materials is performed without heating the base materials.

11. The atomic diffusion bonding method according to claim 2, wherein the overlaying of the base materials is performed without heating the base materials.

12. The atomic diffusion bonding method according to claim 3, wherein the overlaying of the base materials is performed without heating the base materials.

13. The atomic diffusion bonding method according to claim 1, comprising heating the base materials when the base materials are overlaid at a temperature from room temperature to 400° C. to accelerate atomic diffusion.

14. The atomic diffusion bonding method according to claim 2, comprising heating the base materials when the base materials are overlaid at a temperature from room temperature to 400° C. to accelerate atomic diffusion.

15. The atomic diffusion bonding method according to claim 3, comprising heating the base materials when the base materials are overlaid at a temperature from room temperature to 400° C. to accelerate atomic diffusion.

16. The atomic diffusion bonding method according to claim 1, wherein the formation of the bonding film and/or the overlaying of the base materials are performed in a vacuum vessel with an ultimate vacuum pressure of from $1\times10^{-3}$ Pa to $1\times10^{-8}$ Pa.

17. The atomic diffusion bonding method according to claim 2, wherein the formation of the bonding film and/or the overlaying of the base materials are performed in a vacuum vessel with an ultimate vacuum pressure of from $1\times10^{-3}$ Pa to $1\times10^{-8}$ Pa.

18. The atomic diffusion bonding method according to claim 3, wherein the formation of the bonding film and/or the overlaying of the base materials are performed in a vacuum vessel with an ultimate vacuum pressure of from $1\times10^{-3}$ Pa to $1\times10^{-8}$ Pa.

19. The atomic diffusion bonding method according to claim 1, wherein the formation of the bonding film and the overlaying of the base materials are performed in the same vacuum.

20. The atomic diffusion bonding method according to claim 2, wherein the formation of the bonding film and the overlaying of the base materials are performed in the same vacuum.

21. The atomic diffusion bonding method according to claim 3, wherein the formation of the bonding film and the overlaying of the base materials are performed in the same vacuum.

22. The atomic diffusion bonding method according to claim 1, wherein the bonding film is formed from a nitride containing one or more elements selected from Groups 13 and 14 of Period 2 to 5 of a periodic table.

23. The atomic diffusion bonding method according to claim 2, wherein the bonding film is formed from a nitride containing one or more elements selected from Groups 13 and 14 of Period 2 to 5 of a periodic table.

24. The atomic diffusion bonding method according to claim 3, wherein the bonding film is formed from a nitride containing one or more elements selected from Groups 13 and 14 of Period 2 to 5 of a periodic table.

25. The atomic diffusion bonding method according to claim 1, wherein the bonding film is formed from a nitride containing one or more elements selected from Groups 3 to 12 of Period 4, and Groups 3 to 6 of Period 5 and 6 of a periodic table.

26. The atomic diffusion bonding method according to claim 2, wherein the bonding film is formed from a nitride containing one or more elements selected from Groups 3 to 12 of Period 4, and Groups 3 to 6 of Period 5 and 6 of a periodic table.

27. The atomic diffusion bonding method according to claim 3, wherein the bonding film is formed from a nitride containing one or more elements selected from Groups 3 to 12 of Period 4, and Groups 3 to 6 of Period 5 and 6 of a periodic table.

28. The atomic diffusion bonding method according to claim 1, wherein a film thickness of the bonding film is from 0.3 nm to 5 μm.

29. The atomic diffusion bonding method according to claim 2, wherein a film thickness of the bonding film is from 0.3 nm to 5 μm.

30. The atomic diffusion bonding method according to claim 3, wherein a film thickness of the bonding film is from 0.3 nm to 5 μm.

\* \* \* \* \*